(12) United States Patent
Chua et al.

(10) Patent No.: US 7,713,388 B2
(45) Date of Patent: May 11, 2010

(54) OUT-OF-PLANE SPRING STRUCTURES ON A SUBSTRATE

(75) Inventors: Christopher L. Chua, San Jose, CA (US); Thomas Hantschel, Moorsele (BE); David K. Fork, Los Altos, CA (US); Koenraad F. Van Schuylenbergh, Fremont, CA (US); Yan Yan Yang, Union City, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 346 days.

(21) Appl. No.: 11/364,111

(22) Filed: Feb. 27, 2006

(65) Prior Publication Data
US 2007/0202310 A1 Aug. 30, 2007

(51) Int. Cl.
C23C 14/34 (2006.01)
(52) U.S. Cl. ............... 204/192.15; 204/192.16; 205/118; 205/122; 205/266; 205/271; 205/263; 205/291; 438/117; 438/611; 438/666; 438/678; 438/754
(58) Field of Classification Search .......... 204/192.15, 204/192.16; 205/118, 122, 266, 271, 263, 205/291; 438/117, 611, 666, 678, 754
See application file for complete search history.

(56) References Cited

U.S. PATENT DOCUMENTS

| 5,613,861 | A | * | 3/1997 | Smith et al. ............ 439/81 |
| 5,825,275 | A | * | 10/1998 | Wuttig et al. ............ 337/139 |
| 5,965,494 | A | * | 10/1999 | Terashima et al. ......... 505/210 |
| 6,245,444 | B1 | * | 6/2001 | Marcus et al. ............ 428/616 |
| 6,255,126 | B1 | * | 7/2001 | Mathieu et al. ........... 438/15 |
| 6,392,524 | B1 | * | 5/2002 | Biegelsen et al. ......... 336/200 |
| 6,528,350 | B2 | * | 3/2003 | Fork ..................... 438/117 |
| 6,582,989 | B2 | | 6/2003 | Biegelsen et al. |
| 6,621,141 | B1 | | 9/2003 | Van Schuylenbergh et al. |
| 6,947,291 | B2 | | 9/2005 | Chua et al. |
| 2003/0192476 | A1 | * | 10/2003 | Fork et al. .............. 118/719 |
| 2003/0214045 | A1 | * | 11/2003 | Lahiri et al. ............. 257/761 |

OTHER PUBLICATIONS

Fork, David K., et al., "Wafer Level Packaging using StressedMetal™ Technology," Palo Alto Research Center, California (8 pages).

* cited by examiner

*Primary Examiner*—Rodney G McDonald
(74) *Attorney, Agent, or Firm*—Marger Johnson & McCollom, P.C.

(57) ABSTRACT

A structure has at least one structure component formed of a first material residing on a substrate, such that the structure is out of a plane of the substrate. A first coating of a second material then coats the structure. A second coating of a non-oxidizing material coats the structure at a thickness less than a thickness of the second material.

11 Claims, 4 Drawing Sheets

OUT-OF-PLANE SPRING STRUCTURES ON A SUBSTRATE

FIELD

This disclosure relates to stress engineered springs on a semiconductor substrate and more particularly to out-of-plane structures formed by such springs.

BACKGROUND

Microfabricated, stress-engineered springs can be used in applications ranging from electrical interconnects, to high density probe cards to on-chip high quality factor out-of-plane inductors. The process for manufacturing these springs may include depositing material, possibly in layers, with compressive stress towards the bottom of the structure and tensile stress towards the top. The material with the variable stress resides on a release layer. When an end or ends of the structure formed of the material is freed from the release layer, the stress variant causes the ends of the structure to curl up out of the plane of the substrate upon which the release layer and material reside.

The methods of forming the variable stress structure include sputtering or electroplating as examples. U.S. Pat. No. 5,613,861, "Photolithographically Patterned Spring Contact," issued Mar. 25, 1997 describes a method of forming the structure by sputtering. When sputter-depositing a metal, a plate of the metal, called the target, is placed on a cathode, which is set to a high negative potential and immersed in a low-pressure gas. This causes a glow-discharge plasma to ignite, from which positive ions are accelerated into the negatively charged target. This ion bombardment knocks metal atoms off the target, and many of these deposit on nearby surfaces, such as a substrate. The metal layer may be thought of as deposited in several sub-layers to a final thickness. A stress gradient is introduced into the metal layer by altering the stress inherent in each of the sub-layers, each sub-layer having a different level of inherent stress. These different stress levels can be introduced into each sublayer during sputter deposition in a variety of ways, including adding a reactive gas to the plasma, depositing the metal at an angle, and changing the pressure of the plasma gas.

Another approach is to form the release layer out of a conductive material and use it as an electrode in electroplating different layers having different stress properties to form the structures. For example, a first layer may be formed of a first layer, such as nickel electroplated using a first chemical bath and then a second layer formed from nickel electroplated using a second chemical bath. The second chemical bath produces nickel with different atomic structure as the first chemical bath resulting in a different stress characteristic for the second layer.

Electroplating may also be performed after the formation of the spring structures, for better stability or control of the properties of the spring structures. An example of such an electroplating process is discussed in U.S. Pat. No. 6,528,350, "Method for Fabricating a Metal Plated Spring Structure," issued Mar. 4, 2003.

However the stress engineered metal structure is formed, it is selectively released from the release layer, allowing the ends of the structures to curl up away from the substrate. These curled structures are generally referred to as springs. One possible structure that can be made from these springs is an out-of-plane inductor. Out-of-plane inductors have an advantage over two-dimensional inductors in that the electromagnetic fields generated by running current through an out-of-plane inductor does not penetrate the substrate as much as those produced by two-dimensional inductors. This results in less eddy currents in the substrate and less energy loss.

In an example of a manufacturing process for out-of-plane inductors, two springs are manufactured facing each other in a mirrored fashion with latching structures on their ends. When the ends of each spring are released, they curl up towards each other, and the latching structures interlock, forming a coil. Examples of this manufacturing process are described in U.S. Pat. No. 6,621,141, "Out of Plane Microcoil with Ground Plane Structure," issued Sep. 16, 2003, and U.S. Pat. No. 6,947,291, "Photolithographically Patterned Out-of-Plane Coil Structures and Method of Making," issued Sep. 20, 2005.

The process of releasing and curling of the springs to cause them to latch requires very tight process controls and increases the cost of manufacture.

SUMMARY

An embodiment is a structure that has at least one structure component formed of a first material residing on a substrate, such that the structure is out of a plane of the substrate. A first coating of a second material then coats the structure. A second coating of a non-oxidizing material coats the structure at a thickness less than a thickness of the second material.

Another embodiment is a method of forming an out-of-plane structure. The method includes depositing a release layer on a substrate, and depositing a variable stress layer on the release layer. Structure components are formed on the release layer. The structure components are released from the release layer. The structure components are then coated with a conductive material and a non-oxidizing material.

DETAILED DESCRIPTION

Figure 1:
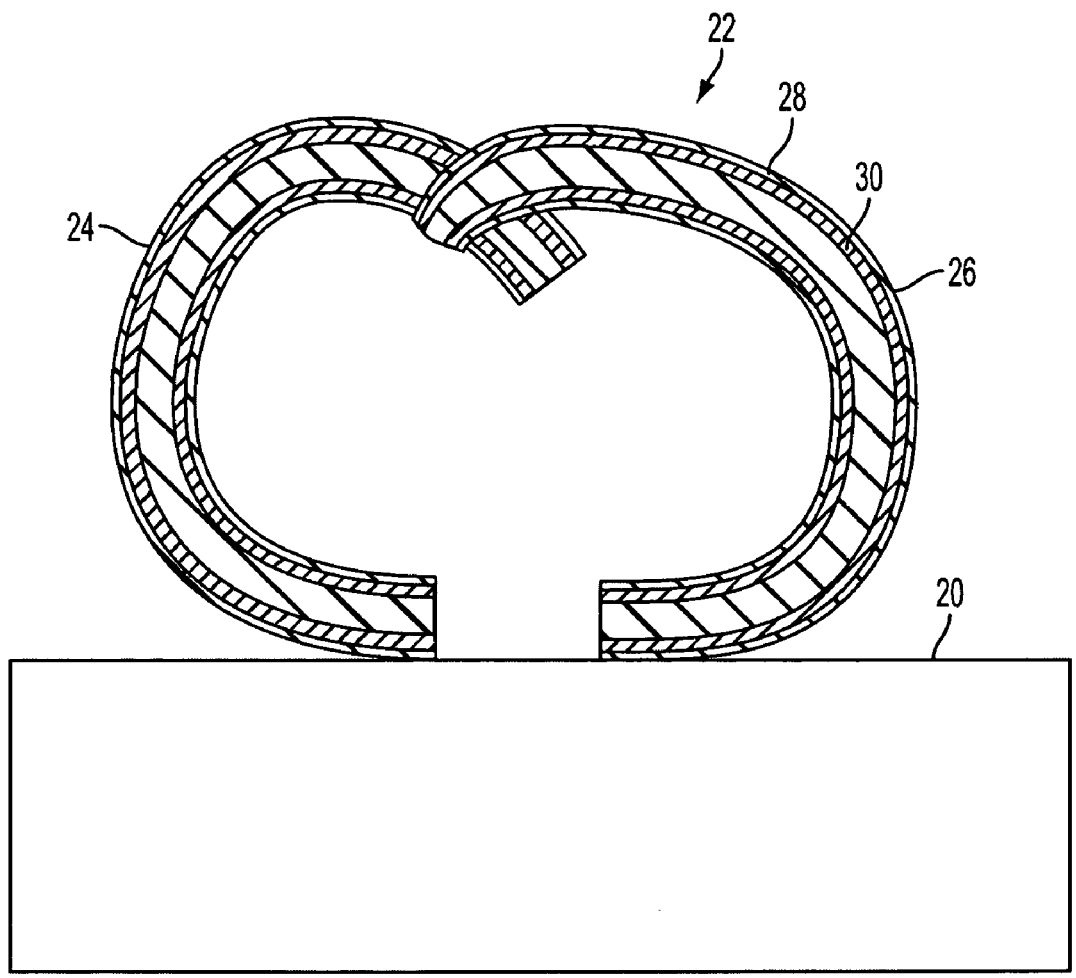
FIGS. 1 and 2 are side cross-sectional views of embodiments of an out-of-plane structure formed from stress engineered spring material.

FIG. 1 shows an embodiment of an out-of-plane coil 22 formed of two spring structures 24 and 26. When released from the release layer on substrate 20, the two springs curl up out of the plane of the substrate to the point where they connect. The ends of the spring structures 24 and 26 may have features that allow them to latch or otherwise interlock together. Once formed, the structure is plated with a first coating 30, generally of a conductive material, such as copper, nickel or silver.

During formation of the springs, the speed and extent of the coiling motion that results in their interlocking is partially controlled by a load layer. The load layer is generally a material that can be softened or reflowed by application of heat or by exposure to a reactant gas or vapor. When the load layer softens, the load on the springs is reduced and the springs curl up to come into contact. After the springs successfully assemble into a coil, the load layer material is removed with a chemical.

In one embodiment, photoresist forms the load layer. The photoresist load can be reflowed by heating it to temperatures of around 200° C.

In one embodiment, unloaded spring diameters of between 490-580 micrometers (μm) generally lead to successful coil assembly. In the same embodiment, it has been discovered that application of higher heat to the structure during the assembly process allows successful spring assembly even if the unloaded spring diameter is as large as 900 μm, an over 50% improvement in process tolerance.

In one embodiment, the stress-engineered metal was formed by sputtering a molybdenum chrome alloy. It was discovered that heating the stress-engineered metal to temperatures above 250° C. triggered microstructure changes that enable much larger unloaded spring diameters to assemble properly into coils. However, the application of higher heat causes the load layer material to cross-link and harden, making removal of the material via a solvent etch ineffective. Due to the highly oxidizing characteristic of the first coating, the load layer material cannot be removed by such procedures as an oxygen plasma ashing. To subject the first coating to such a process would render the coil unusable.

It is possible to protect the first coating such that higher temperatures can be applied, and the hardened photoresist can be removed with similar procedures to the oxygen plasma ashing without destroying the structure. The structure of FIG. 1 has a second coating 28 of a non-oxidizing material such as gold. The second coating has a thickness that is less than the electrical skin depth of a desired operating frequency of the coil 22.

It must be noted that the thickness of the second coating is referred to as having a thickness less than the electrical skin depth, which is typically defined only for structures used in an electrical circuit at a given frequency. However, the electrical skin depth may be used for those components not actually used in an electrical circuit, but may be defined as if the structure were to be used in an electrical circuit, even it will not be so used.

Figure 2:
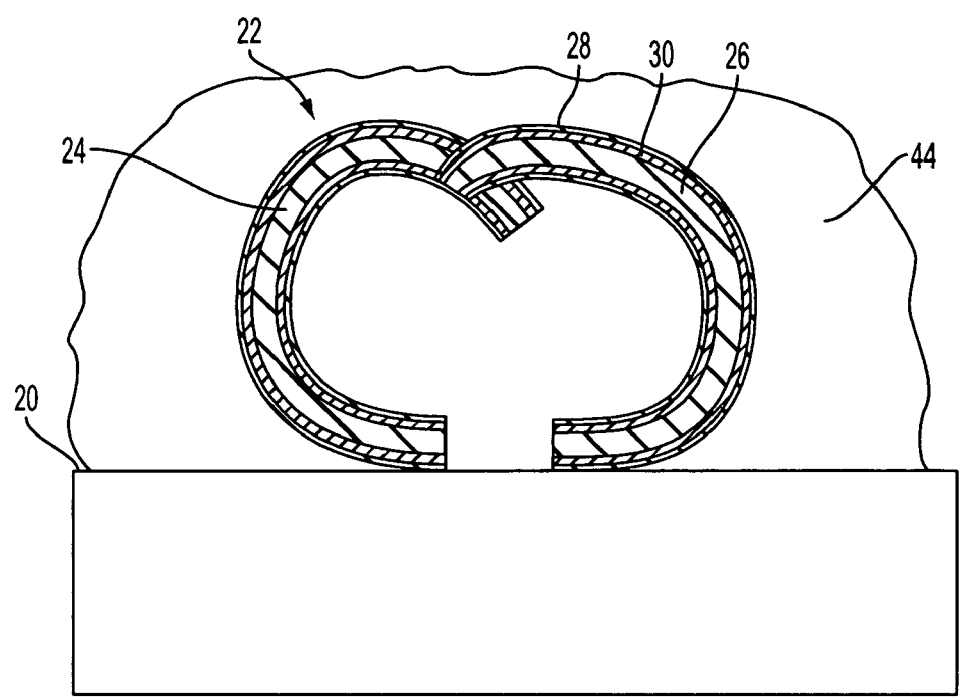

If the gold coating 28 is thicker than the electrical skin depth, the current will be forced out to the gold coating. Because gold and similar materials typically have a higher resistance than copper, the performance of the coil 22 will degrade if the non-oxidizing layer is too thick. For further protection, the structure 22 may be embedded in an encapsulating resin 44, shown in FIG. 2.

The non-oxidizing layer 28 has an added advantage in that it protects the structure in normal conditions. The first coating 30 will degrade over time due to oxidation. For example, a coil structure with an unprotected first copper coating left at room ambient for 3 months would experience a decrease in coil quality factor (Q) from approximately 80 at 1 GHz frequency to approximately 50 at 1 GHz frequency. The addition of the non-oxidizing layer alleviates this problem.

Adjustments to the assembly process for these structures may be altered to provide this second coating. It must be noted that the discussion with regard to FIG. 1 focuses on coils, as does the discussion of the process. This is not intended to limit application of any of the embodiments of the invention to out of plane inductor coils. Any out of plane structure, such as springs and cantilevers may benefit from the embodiments discussed here.

Figure 3:
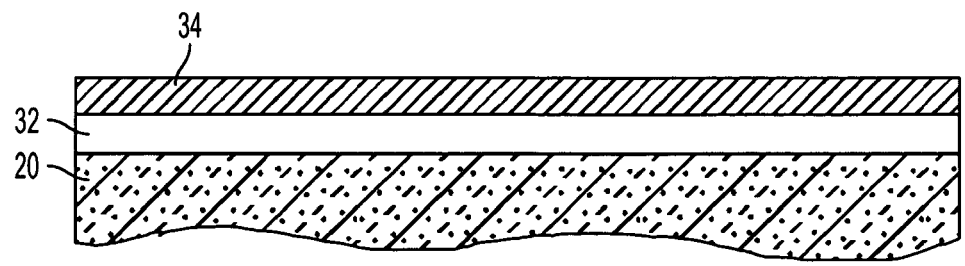
FIGS. 3-8 are side cross-sectional views showing a process of manufacturing an out-of-plane structure.

FIGS. 3-8 demonstrate an embodiment of a process of manufacturing an out of plane structure having a non-oxidizing coating. In FIG. 3, a substrate 20, such as silicon or glass receives a deposited release layer 32. The manufacturing process will typically involve electroplating, so it may be beneficial for the release layer to be a conductive material. In one embodiment, titanium is used.

The structure material 34 is then deposited on the release layer, shown in FIG. 3. As discussed previously, the structure material is a stress-engineered material, meaning that the material has a stress gradient, or that the stress varies from the bottom of the material lying on the release layer to the top of the material. This may also be referred to as a variable stress material.

As discussed previously, the different stress levels can be introduced into each sublayer during sputter deposition of the spring material onto the release layer. The stress levels may be controlled in a variety of ways, including adding a reactive gas to the plasma, depositing the metal at an angle, and changing the pressure of the plasma gas. Another approach would be to form the release layer out of a conductive material and use it as an electrode in electroplating different layers having different stress properties to form the structures. For example, a first layer may be formed of a first layer, such as nickel and then a second layer formed from a nickel alloy having slighting different chemical makeup resulting in a different stress characteristic for the second layer. Regardless of how it is formed, the stress engineered layer should have the characteristic that it curls up out of the plane of the substrate when released from the release layer.

Figure 4:
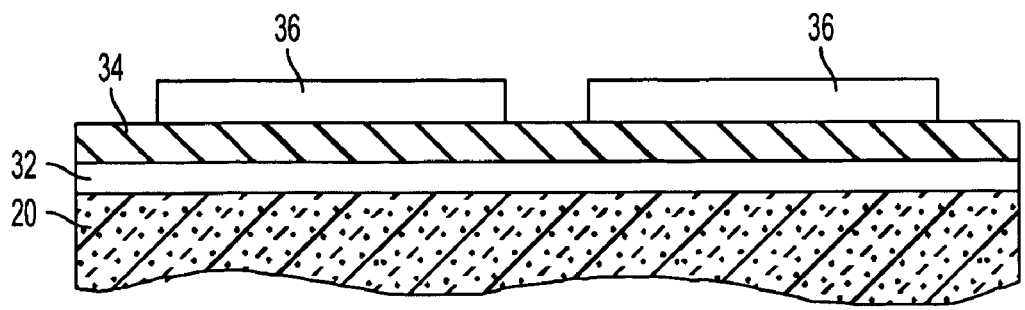

In FIG. 4, a structure mask 36 is deposited and patterned to form the individual structures. The structure mask will protect those portions of the spring material layer 34 that will form the structures. For structures that comprise multiple sub-structures, such as a coil formed of two springs, the individual structures will be referred to as structure components, with the structure referring to the substrate, the various portions of the layers used in forming the structure and the structure components.

Figure 5:
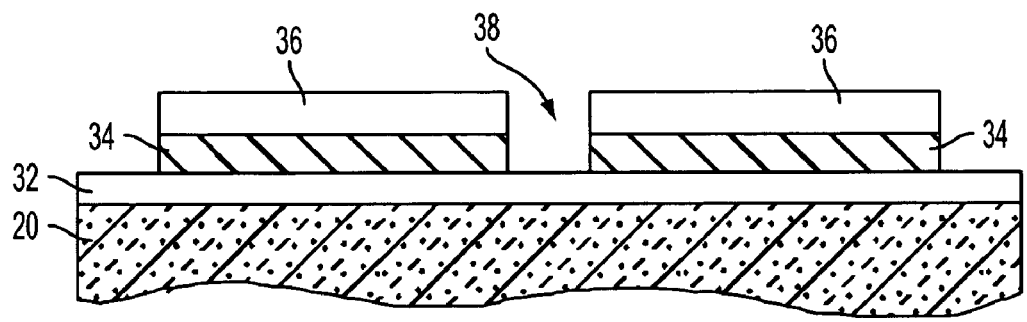

FIG. 5 shows the result of a structure etch, in which the structure material 34 has been selectively removed from the structure, such as in gap 38. At the conclusion of the structure etch, the remaining portions of structure mask 36 would also be removed.

Figure 6:
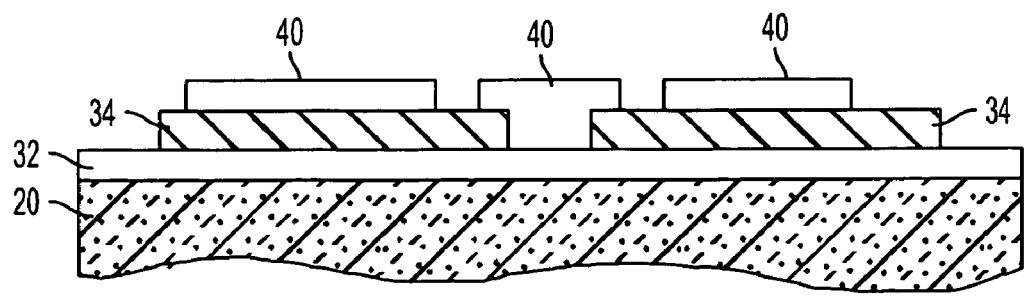

FIG. 6 shows application of a release mask. The release mask will protect portions of the structure layer 34 and will form the load members used in structure assembly for coils. An etch of the release mask will also selectively etch portions of the release layer 32 away from under the portions of the structure layer 34. An example of a resulting structure is shown in FIG. 7.

Figure 7:
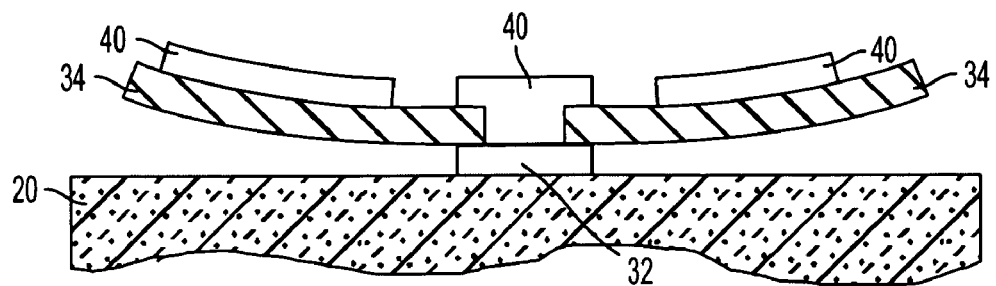

In FIG. 7, load members 40 remain on the structure layer, while a portion of the release layer 32 remains under the structure components, providing electrical and mechanical connection between the release layer and the structure layer. The portion of the release layer 32 may also serve as the electroplating contact for the structure.

Figure 8:
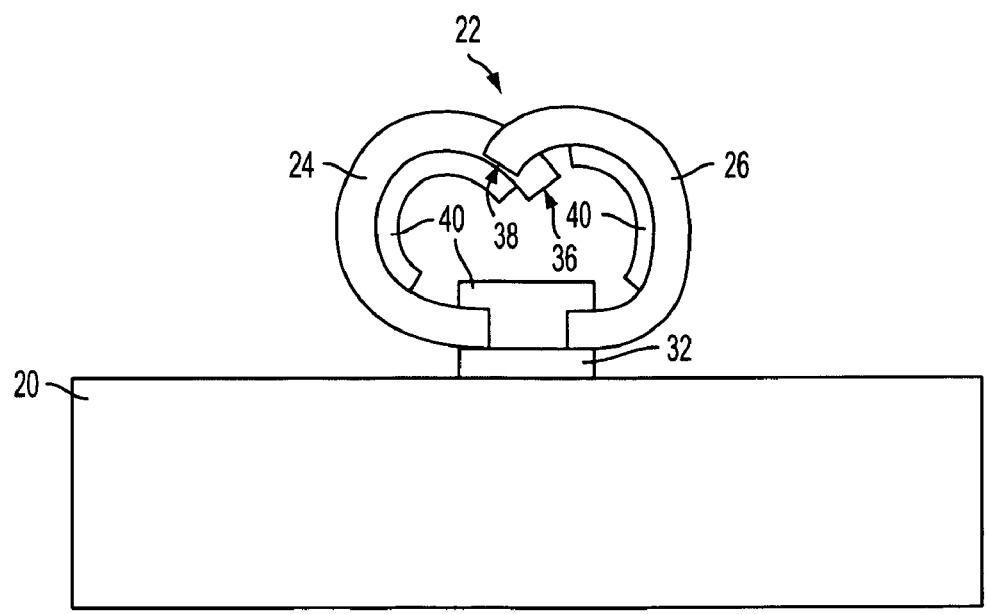

FIG. 8 shows an embodiment of a result of heating the structure to cause the load members 40 to soften or re-flow. Further heating to produce microstructure changes in the structure to cause larger spring movement may also be employed in circumstances where softening the load alone is not sufficient. The lessening of the load caused by the load members and the microstructure changes result in the two spring structures forming a coil, in the embodiment where the structure is a coil. It must be noted that some of the processes disclosed here may not be necessary to form other structures. For example, the load members may not be needed in forming a spring or cantilever, as those structures may move out of the plane of the substrate in a manner that is controllable in other ways. Further, the heating to cause the reflow may not be necessary.

The heating of the structure to cause the load material to soften or to effect microstructure changes is a convenient process to build structures that are to form coils. While other structures may not involve load members or the formation of coils, these structures, such as springs and cantilevers may still benefit from the technique and from the use of a non-oxidizing layer to protect the conductive layer from oxidation as discussed above. The structure may be referred to as having been formed of a first material. Examples of candidate materials for the first material include molybdenum chrome, nickel zirconium, nickel, copper, tungsten, gold and plastic.

Once the structures are assembled, such as in the coil shown in FIG. 8, the structure is coated with a second material, such as copper, silver or nickel. The structure is then plated with a non-oxidizing material such as gold to protect it. The non-oxidizing coating can be applied using the same mask and electrode as that used in the preceding process, so it does not add to the complexity of the manufacturing process.

During coil assembly, the structure can be heated to a point where the load layer material, typically a photoresist, becomes burnt. A reason for heating the structure to such high temperatures could be to cause microstructure changes that allow the structure to curl away further from the substrate than would otherwise be possible with just softening the load layer alone. The higher process temperature increases process tolerance allowing structure material 34 to have widely varying as-deposited stress gradients to still be successfully assembled into coils. An undesirable side effect, however, is that the load layer material becomes difficult to remove using usual solvents. In this circumstance, the photoresist load layer could be removed using aggressive oxygen plasma ashing with the non-oxidizing layer 28 in FIG. 1 protecting conductive layer 30 from damage. In some embodiments, it would be beneficial to add a diffusion barrier such as nickel between the first material and the non-oxidizing coating. During experiments, no significant degradation in the Q factors was found in coils having the non-oxidizing layer.

While the above description focused on forming and coating a coil inductor, other possible structures could be formed and coated, such as probes, springs and cantilevers. Further, the plating of a non-oxidizing layer could be applied to other structures that were formed by other processes. In this process, a first coating of a first material would be applied to a structure component. A second coating of a second material would be applied to the first coating. The resulting structure would be able to withstand further processing that would otherwise be destructive to the first coating.

It will be appreciated that various of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

The invention claimed is:

1. A method of forming an out-of-plane structure, comprising:
    depositing a release layer on a substrate;
    depositing a variable stress layer on the release layer;
    forming structure components in the variable stress layer;
    forming load members on the variable stress layer;
    heating the structure to cause the load members to lessen a load characteristic to allow the structure component to curl away from the release layer;
    further heating the structure to cause microstructure changes in the structure components thereby causing the structure components to further curl away from the release layer forming the out-of-plane structure;
    coating the structure with a conductive material forming a coated structure; and
    coating the coated structure with a non-oxidizing material.

2. The method of claim 1, wherein depositing a variable stress layer further comprises sputter depositing multiple sublayers, each sublayer having a different stress characteristic.

3. The method of claim 1, wherein depositing a variable stress layer further comprises electroplating at least two layers on the substrate, wherein each layer has a different stress characteristic.

4. The method of claim 1, forming structure components in the release layer further comprising:
    depositing a structure mask layer;
    patterning the structure mask layer to define the structure components;
    etching the structure mask layer to expose a portion of the release layer; and
    etching the release layer to form the structure components.

5. The method of claim 1, wherein forming load members on the variable stress layer and partially releasing the structure components from the release layer further comprises:
    depositing a release mask layer on the structure components;
    patterning the release mask to form load members over the structure components; and
    etching the release layer, causing the structure components to curl away from the release layer.

6. The method of claim 5, wherein patterning the release mask further comprises patterning the release mask to form protective portions such that the protective portions form the load members for the structure components.

7. The method of claim 5, wherein further heating the structure comprises continuing to heat the structure to cause the structure components curl away from the release layer to mate with opposing structure components to form loops.

8. The method of claim 1, wherein coating the structure with a conductive material further comprises electroplating the structure with one selected from the group consisting of: copper, nickel or silver.

9. The method of claim 1, wherein coating the coated structure further comprises electroplating the coated structure with gold.

10. The method of claim 1, the method further comprising forming a diffusion barrier on the coated structure prior to coating the second material on the coated structure.

11. The method of claim 5, the method further comprising removing remnants of the release mask with an oxygen plasma ashing.

* * * * *